(12) United States Patent
Mishonov et al.

(10) Patent No.: US 7,471,169 B2
(45) Date of Patent: Dec. 30, 2008

(54) GENERATION OF ELECTRIC OSCILLATIONS BY CONTINUOUS, SUPERCOOLED SUPERCONDUCTORS UNDER A VOLTAGE

(75) Inventors: Todor Mihaylov Mishonov, Sofia (BG); Mihail Todorov Mishonov, Sofia (BG)

(73) Assignee: K.U. Leuven Research & Development, Leuven (BE)

( * ) Notice: Subject to any disclaimer, the term of this patent is extended or adjusted under 35 U.S.C. 154(b) by 67 days.

(21) Appl. No.: 10/547,879

(22) PCT Filed: Mar. 3, 2004

(86) PCT No.: PCT/BE2004/000032

§ 371 (c)(1),
(2), (4) Date: Sep. 2, 2005

(87) PCT Pub. No.: WO2004/079893

PCT Pub. Date: Sep. 16, 2004

(65) Prior Publication Data

US 2006/0097809 A1 May 11, 2006

(30) Foreign Application Priority Data

Mar. 3, 2003 (GB) ................................ 0304786.7
Jul. 23, 2003 (GB) ................................ 0317119.6

(51) Int. Cl.
*H01P 7/00* (2006.01)

(52) U.S. Cl. .................... 333/99 S; 505/204; 505/210

(58) Field of Classification Search ................ 333/99 S; 505/210, 204
See application file for complete search history.

(56) References Cited

U.S. PATENT DOCUMENTS

| 3,778,893 A | 12/1973 | Thompson |
| 4,754,384 A | 6/1988 | Levy et al. |
| 5,118,660 A * | 6/1992 | Riebman .................... 505/204 |
| 6,791,432 B2 * | 9/2004 | Smith et al. ................. 333/99 S |

FOREIGN PATENT DOCUMENTS

| DE | 1263112 | 3/1968 |
| EP | 0 372 951 B1 | 6/1990 |
| EP | 0 744 827 A1 | 11/1996 |
| JP | 01176102 | 7/1989 |

OTHER PUBLICATIONS

Athas et al., "Tunnel Diode Oscillator Application to High Sensitivity De Haas-Van Alphen and Superconducting Critical Field Studies of Anisotropic Organic Conductors," *Rev. Sci. Instrum.* 64: 3248-3251 (1993).

(Continued)

*Primary Examiner*—Benny Lee
(74) *Attorney, Agent, or Firm*—Clark & Elbing LLP

(57) ABSTRACT

The essence of the invention is the use of supercooled superconductors for generation of high-frequency electric oscillations. The superconductor is supercooled, i.e. in the normal phase at a temperature lower than the critical transition temperature for superconductivity, under an applied electric energy source. In such non equilibrium conditions the superconductor can have negative differential conductivity which can be used as an active medium in generators of electric (current and voltage) oscillations. Such generators can be used in the superconducing electronics. Oscillation can be modulated by the change of bias voltage, electrostatic doping by a gate electrode, or by light. When small amplitude oscillations are stabilized near to the critical temperature the generator can be used as a bolometer. The supercooled superconductors can be used also as transistors and frequency mixers. The negative differential conductivity of superconductor is created by the excess conductivity of fluctuation Cooper pairs. This behavior is predicted by the solution of the Boltzmann kinetic equation of the metastable in the normal phase Cooper pairs. Boltzmann equation for fluctuation Cooper pairs is derived as a state-of-the-art application of the microscopic theory of superconductivity.

21 Claims, 3 Drawing Sheets

OTHER PUBLICATIONS

Buckel, Superconduction, 4th Revised & Enlarged Edition, pp. 147-149, VCH (1990).
Buckel, Supraleitung, 4., überzrbeitete und ergänzte Auflage, pp. 147-149, VCH (1990).
Gevorgyan et al., "Modeling of Tunnel Diode Oscillators and Their Use for Some Low Temperature Investigations," *Rev. Sci. Instrum.* 69: 2550-2560 (1998).
Chow, *Principles of Tunnel Diode Circuits*. Wiley: New York (1964).
Damianov and Mishonov, "Fluctuation Paraconductivity within the Framework of Time-Dependent Ginzburg-Landau Theory," *Superlatt. Microstruc.* 21:467-470 (1997).
Dubois et al., "Fabrication and Properties of Arrays of Superconducting Nanowires," *J. Mater. Res.* 14:665-671 (1999).
Enns et al., *Computer Algebra Recipes: A Gourmet's Guide to Mathematical Models of Science.*, Chapter 7, Nonlinear ODE Models, pp. 397-458 Springer: New York, (2001).
Ferain et al., "Characterisation of Nanoporous Particle Track Etched Membrane," *Nucl. Instrum. Methods Phys. Res. B* 131:97-102 (1997).
Ferguson et al., "Materials for Terahertz Science and Technology," *Nat. Mater.* 1:26-33 (2002).
Gor'kov et al., "Singularities of the Resistive State with Current in Thin Superconducting Films," *Sov. Phys. JETP Lett.* 11:32-35 (1970).
Larkin et al., "Fluctuation Phenomena in Superconductors," *Handbook on Superconductivity: Conventional and Unconventional Superconductors*. Benneman and Ketterson (eds.), Springer: Berlin, 1-126 (2002).
Martin, "Nanomaterials: A Membrane-Based Synthetic Approach," *Science* 266:1961-1966 (1994).
Michotte et al., "Superconducting Properties of Lead Nanowires Arrays," *Physica C* 377:267-276 (2002).
Mishonov et al., "Fluctuation Conductivity in Superconductors in Strong Electric Fields," *Phys. Rev. B.* 65:64519-1 to :64519-13 (2002).
Mishonov et al., "Kinetics and Boltzmann Kinetic Equation for Fluctuation Cooper Pairs," *Phys. Rev. B.* 68:54525-1 to 54525-8 (2003).
Mishonov et al, "Kinetic Equation for Fluctuation Cooper Pairs Applied to Fluctuation Hall Effect in Thin Superconducting Films," *Czech. J. Phys. Supp. S2* 46:631-632, (1996).
Mishonov et al, "Thermodynamics of Gaussian Fluctuations and Paraconductivity in Layered Superconductors," *Int. J. Mod. Phys. B.* 14:3831-3879 (2000).
Press et al., *Numerical Recipes in Fortran 77: The Art of Scientific Computing*. "Chapter 16. Integration of Ordinary Differential Equations", vol. 1, 2nd ed., Cambridge University Press: New York, pp. 701-744 (2001).
Yi et al., "Single Crystal Superconductor Nanowires by Electrodeposition," *Appl. Phys. Lett.* 74:1746-1748 (1999).
International Search Report (PCT/BE2004/000032) mailed Sep. 2, 2004, (Oct. 21, 2004 is the date on which the document was made available on Patent Scope Search Service).
International Preliminary Report on Patentability (PCT/BE2004/000032) mailed May 24, 2005, (Sep. 3, 2005 is the date on which the document was made available on Patent Scope Search Service).
Written Opinion of the International Searching Authority (PCT/BE2004/000032) mailed Sep. 2, 2004, (Sep. 3, 2005 is the date on which the document was made available on Patent Scope Search Service).
Mishonov et al., "Theory of Terahertz Electric Oscillations by Supercooled Superconductors," *Supercond. Sci. Technol.* 18:1506-1512 (2005).

* cited by examiner

GENERATION OF ELECTRIC OSCILLATIONS BY CONTINUOUS, SUPERCOOLED SUPERCONDUCTORS UNDER A VOLTAGE

CROSS REFERENCE TO RELATED APPLICATIONS

This application is the U.S. National Stage of International Application No. PCT/BE2004/000032, filed Mar. 3, 2004, which, in turn, claims the benefit of GB Application Nos. 0304786.7 and 0317119.6 filed Mar. 3,2003 and Jul. 23, 2003, respectively.

TECHNICAL FIELD OF THE INVENTION

The present invention relates to a method, device and system for generating terahertz frequency oscillations. More particularly, the present invention relates to a method and system for generation of a gigahertz or terahertz frequency oscillations with a high output power.

BACKGROUND OF THE INVENTION

Due to their low ohmic dissipation, superconductors have the potential of many technical applications. Superconductors can be used in resonators, cables, electromagnets, transformers, electric motors and generators. Another technical application is the superconductor based implementation of quantum information devices based on the Josephson effect.

Generally, there is a lot of interest for terahertz frequency oscillators based on superconductor materials. Several terahertz frequency oscillators are known based on the Josephson effect using a Josephson junction. Typically a Josephson junction is made up of two superconductors, separated by a non-superconducting layer which is so thin that electrons can cross the insulating barrier by tunnelling. Some examples of the use of these junctions for terahertz frequency oscillators are described in e.g. European Patent application EP0 372 951, describing a Josephson junction comprising an oxide superconductor thin film, in U.S. patent application U.S. Pat. No. 3,778,893, describing a method for fabricating oscillator by placing a Josephson junction in an external field, and in European Patent application EP0 744 827 A1 describing a method for making a high frequency oscillator by applying a voltage to a Josephson device. However, up to now there has been little progress in the development of superconductors as active elements in e.g. electrical circuits, mainly because the terahertz frequency oscillators based on the Josephson effect have only a weak output power.

SUMMARY OF THE INVENTION

It is an object of the present invention to provide a gigahertz or terahertz frequency generator with a high output power.

The above objective is accomplished by a method and device according to the present invention.

The invention relates to an arrangement for a gigahertz or terahertz frequency oscillator comprising a length of continuous, superconductor material that is at least partly supercooled and an energy source adapted for generating terahertz frequency electric oscillations in at least part of the supercooled, continuous, superconductor material. With superconductor material, any material wherein superconductivity can be obtained is meant. Superconductor materials can be, but are not limited to superconducting metal oxides, ceramic oxides, organic materials, semiconductors, metals, mixtures of oxides or mixtures of the above mentioned materials. Both type I and type II superconductor materials can be used. The energy source preferably is a means for directly providing an electric field to the superconductor material, but it may also be, in a less preferred embodiment, a source for providing an electric field indirectly. The power source may be external to a device including the continuous superconductor material, i.e. a separate device, or may be integrated with the device including the continuous superconductor material. "Continuous, superconductor material" means that the superconductor material is a single piece of at least one superconductor material. This means that between each two points in the superconductor material a connection is provided which consists of superconductor material. "Supercooled" means that, although at least part of the continuous, superconductor material is cooled under the critical temperature for superconductivity, the part is not in a superconducting state but in a normal, i.e. non-superconducting, state. The critical temperature $T_c$ is defined as the temperature at which transition from the normal non-superconducting state to the superconducting state occurs, if no additional electric field is applied, i.e. if only rest field is present, such as e.g. the earth field. The gigahertz or terahertz frequency electric oscillations may be, for example, within a frequency range of 0.1 to 10 terahertz. This frequency region corresponds with a frequency of $10^{11}$ to $10^{13}$ cycles per second. Oscillation can be modulated by the change of bias voltage, electrostatic doping by a gate electrode, or by light. The arrangement for a gigahertz or terahertz frequency oscillator furthermore may comprise a cooling means for bringing the at least part of the continuous, superconductor material in its supercooled state. At least part of the continuous, superconductor material may be brought in a state of negative differential conductivity. The at least part of the continuous, superconductor material may be at least one nanowire. The electric energy source may comprise a means for applying a voltage to the supercooled continuous superconductor material. The length of continuous, superconductor material may comprise regions adapted for preventing nucleation of the conductivity. The regions adapted for preventing nucleation of the conductivity may comprise de-pairing impurities. The arrangement may furthermore comprise an inductance and/or a capacitor. The continuous, superconductor material furthermore may comprise regions adapted for acting as an inductance and/or a capacitor. The gigahertz or terahertz frequency oscillator may further comprise a means for tuning the gigahertz or terahertz frequency electric oscillations. The means for tuning the gigahertz or terahertz frequency may comprise means for changing the capacitor or inductance if these are present or means for influencing, illuminating or irradiating the negative differential conducting superconductor using light, heat or far infrared radiation.

In other words, the present invention relates to a system for generating gigahertz or THz wave or gigahertz or THz frequency pulses, comprising a supercooled superconductor under voltage or exposed to an electrical field. The superconductor in such a system is brought into a state of negative differential conductivity. In a preferred embodiment, the system may generate a wave or radiation with a frequency between 0.1 to 10 THz, for example.

The invention also relates to a gigahertz or terahertz frequency wave generator, the wave generator using a gigahertz or terahertz frequency oscillator according to the above description, wherein the gigahertz or terahertz frequency electric oscillations generate a gigahertz or terahertz frequency wave or gigahertz or terahertz frequency radiation. The gigahertz or terahertz frequency wave or gigahertz or terahertz frequency radiation may be in the frequency range of 0.1 to 10 THz, for example.

The invention furthermore relates to a transmitter for transmitting gigahertz or terahertz pulses comprising a gigahertz or terahertz frequency wave generator according to the above given description. In other words, the present invention relates to the use of a supercooled superconductor system under voltage or exposed to an external electrical field to generate gigahertz or THz waves or gigahertz or THz radiation. The transmitter may comprise the wave generator and a suitable antenna matched in impedance to free space or the environment. The radiation or wave may be in the range of 0.1 to 10 THz, for example. The gigahertz or THz wave generator thus comprises a supercooled superconductor wherein, by an external electrical field, a state of negative differential conductivity is created.

The invention moreover relates to the use of the above described terahertz frequency oscillator for gigahertz or terahertz spectroscopy or gigahertz or terahertz imaging.

The invention further relates to a method for generating high frequency oscillations, the method comprising the steps of bringing at least part of a length of continuous, superconductor material in a supercooled phase and applying an energy such as electric energy for generating gigahertz or terahertz frequency electric oscillations in the at least part of a continuous, superconductor material. With "supercooled" it is meant that the part that is supercooled is cooled under the critical temperature for superconductivity but that the superconductor material is still in the normal, i.e. non-superconducting, state. The gigahertz or terahertz frequency electric oscillations may be within a frequency range of 0.1 to 10 terahertz, for example. Bringing at least part of the continuous, superconductor material in a supercooled state may comprise bringing at least part of the continuous superconductor material in a state of negative differential conductivity. The method furthermore may comprise tuning the gigahertz or terahertz frequency, e.g. by influencing, irradiating or illuminating the at least part of a continuous, superconductor material with any of visual light, heat or far infrared radiation or by adjusting an electrical component. The method also may comprise generating a gigahertz or terahertz frequency wave or gigahertz or terahertz frequency radiation with the gigahertz or terahertz frequency electric oscillations.

In other words, the present invention relates to a method of generating high frequency electric oscillations by creating a state of negative differential conductivity in a supercooled superconductor or in a superconductor under critical temperature ($T_c$). The high frequency electric oscillations are obtainable by exposing a supercooled superconductor to an external electrical field or putting it under voltage. This can be used to generate gigahertz or terahertz (THz) frequency radiation.

The present invention also relates to a method wherein the high frequency oscillation is obtained by replacing in a conventional known tunnel diode oscillator, the tunnel diode by a superconductor nanowire, wherein at least the nanowires are cooled to at least liquid helium temperatures.

The teachings of the present invention permit the design of improved methods and apparatus for generating gigahertz or THz frequency oscillations.

It is a specific advantage of the present invention that a high output power can be obtained with the gigahertz or terahertz frequency oscillator.

It is furthermore a specific advantage of the present invention that the construction of the gigahertz or terahertz frequency oscillator does not need to be based on ceramic material and thus is less brittle than prior art constructions.

It is also an advantage of the present invention that the device structure is less expensive than the prior art gigahertz or terahertz frequency oscillators based on the Josephson effect.

It is moreover an advantage of the present invention that the material dependence of the system and method for creating gigahertz or terahertz frequency oscillations is limited, thereby allowing the extension of the present invention if superconductors with a higher critical temperature would be discovered in the future.

It is furthermore a specific advantage of the present invention that due to the higher output power for gigahertz or terahertz frequencies, the gigahertz or terahertz frequency oscillator can be used in different applications such as in electronical components for superconducting electronics, in gigahertz or terahertz imaging and spectroscopic techniques, in transmitters such as e.g. in mobile phones.

The application of gigahertz or terahertz frequency oscillations in these different fields allows optimized processing in the corresponding devices, which leads to an increase of the amount and/or the quality of information processed.

The theory is based on some application, but nevertheless can reliably predict the negative differential conductivity which is the main ingredient of the proposed technical applications. The frequency of the electric oscillations created by a superconductors can be very high, comparable to the critical temperature which covers all radiofrequency range up to the far infrared, gigahertz or terahertz, frequencies for high-temperature superconductors.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DETAILD DESCRIPTION OF PREFERRED EMBODIMENTS

Figure 1:
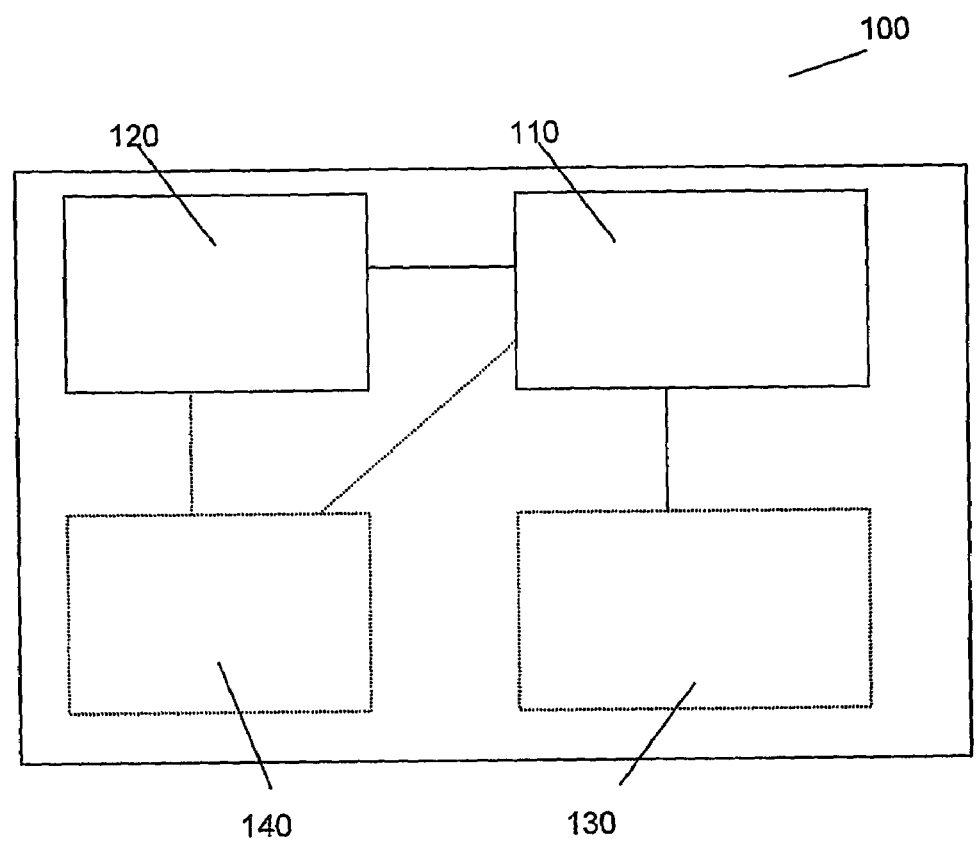
FIG. 1 shows a schematic diagram of gigahertz or terahertz frequency oscillator based on the negative differential conductivity effect in a supercooled superconductor influenced by an electric energy source according to the different embodiments of the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Furthermore, the terms "first", "second", "third" and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms "top", "bottom", "over", "under" and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

The term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

With "supercooled", in the normal state, superconductor material or supercooled superconductor material it is meant that the superconductor material is cooled to a temperature below the critical temperature for superconducting properties, but that the superconductor still is in the normal state, i.e. not in a superconducting state. The superconductor thus is in a metastable state. In the embodiments of the present invention, the supercooled state is obtained by putting the superconductor material under a voltage.

Superconductor material include any material exhibiting superconductive properties, e.g. superconductive elements like e.g. metals, superconductive compounds or alloys including high critical magnetic field superconductive compounds or alloys, high temperature superconductors and organic superconductors, for example as listed in "CRC Handbook of Chemistry and Physics, CRC Press, as printed in 2000-2001 and at roughly yearly intervals.

In this application, with "critical temperature $T_c$" it is meant the transition temperature at which a superconductor material changes from its normal state into its superconducting state, if no additional electric field is applied, and only a rest field is present, such as e.g. the earth field.

Some theoretical aspects are provided to explain the effects and the general principles of the present invention, but the invention relates to the practical embodiments describing the creation of gigahertz or terahertz oscillations in a supercooled superconductor. The invention is not limited by the theoretical aspects.

The different embodiments of the present invention are based on creation of gigahertz or terahertz frequencies in superconductors based on a negative differential conductivity effect. This effect will first be described in more detail. Different physical processes occur in a supercooled in the normal state superconductor that is put under a voltage, e.g. an electric field. In the material, which is in the normal state, thermally activated Cooper pairs are continuously created in its volume. This continuous creation is a stochastic process that is analogous to the Brownian motion but is related to the wave function of the Cooper pairs, the Ginzburg-Landau order parameter. When the temperature is below the critical temperature, i.e. $T<T_c$, the amplitude of the wave function increases with time and the number of fluctuation Cooper pairs also increases. Such wave amplification is analogous to the lasing process in lasers or to the dynamics of the Bose condensation. This is the precursor of the transition of the superconductor to the superconducting phase wherein the superconductor has infinite conductivity. In this phase, the electric current can flow without an external voltage. However, if an external electric field is applied, fluctuation Cooper pairs are prevented from condensing in a coherent superconducting phase. Therefore, the superconducting phase can not exist under an external applied electric energy source. Once fluctuation Cooper pairs are generated, the electric field accelerates the fluctuation Cooper pairs and consequently their kinetic energy increases. On the other hand, the decay rate of the Cooper pairs is energy dependent and increases with energy. The life of faster Cooper pairs may said to be shortened and the electric field finally destroys the accelerated Cooper pairs. During their life, metastable Cooper pairs carry significant electric current, known as fluctuation current, which is comparable and even bigger than the current of normal charge carriers such as electrons or holes, referred to as normal current. The total current in the superconductor is the sum of the fluctuation current and the normal current. Below the $T_c$, the fluctuation current in a superconductor material under a voltage can be comparable with the normal current component.

The principle, on which the embodiments of the present invention are based, is the appearance of negative differential conductivity, i.e. whereby the current increases when the electric field decreases. This behaviour is opposite to ohmic conductivity. As described above, applying a high electric field leads to the decrease of the current flow in a supercooled superconductor, i.e. in the normal state at a temperature lower than the critical temperature. When the applied electric field is smaller, the acceleration of fluctuation Cooper pairs and the decay rate of the fluctuation Cooper pairs will be smaller, such that as a result, the volume density of the fluctuation Cooper pairs is higher and thus the corresponding fluctuation current is higher and consequently the total current is higher. Therefore, the electric current density represented by j(E) increases when the applied electric field E decreases. The change of the electric current density j(E) with changing electric field E is called the differential conductivity $\zeta(E)$ The differential conductivity is defined by Eq. (1)

$$\zeta(E) = \frac{d\,j(E)}{dE} \tag{1}$$

and, as described above, has a negative value for a supercooled, in the normal state superconductor. The normal part of the differential conductivity, represented by $\zeta N(T)$, depends only weakly on the electric field. A more detailed, theoretical description of the different aspects of the differential conductivity of fluctuation Cooper pairs is described in the following paragraphs.

A comprehensive contemporary review on the properties of superconductors can be found in "Fluctuation Phenomena in Superconductors" by Larkin and Varlamov in Physics of Conventional and Unconventional Superconductors, edited by Benneman and Ketterson (Springer, Berlin, 2002). This document, amongst others, gives a detailed explanation of the Bardeen, Cooper and Schrieffer (BCS) theory of superconductivity and a detailed explanation of the time dependent Ginzburg-Landau (TDGL) theory for the order parameter of superconductors. Another review devoted to Gaussian fluctuation in superconductors is described by Mishonov and Penev in Int. J. Mod. Phys. 14, p 3831 (2000). The Boltzmann equation, describing the equilibrium for the fluctuation Cooper pairs, was derived by Mishonov and Damianov in J. Phys. 46 p 631 (1996) and Damianov and Mishonov in Superlattices and Microstructures 21 p 467 (1997). For the case of strong electric fields, the Boltzmann equation was solved by Mishonov et al., as described in Phys. Rev. B 65 p 64519 (2002) and its references and a general formula for the fluctuation current was also derived. In similar way, Mishonov et al. derived the Boltzman equation for high electric field and a general formula for the fluctuation current from the time dependent Ginzburg-Landau theory described by Mishonov et al in Phys. Rev. B65 (2002) p 54525. The formula is similar to the formula obtained by Gor'kov in Sov. Phys. JETP Left. 11 p 32 (1970), who pointed out the region of the negative differential conductivity for small electric fields below $T_c$. From the above described documents, the fluctuation current is given by Eg. (2)

$$j_{fl}(E_x) = \frac{e^2 \tau_{rel} E_x}{16\hbar[\pi^{1/2}\xi(0)]^{D-2}} \int_0^\infty \frac{\exp(-\varepsilon u - gu^3)}{u^{(D-2)/2}} du \qquad (2)$$

Differentiating the formula for the fluctuation current leads to the formula for the total differential conductivity given by the following equation, $$\zeta_{diff}(E) = \zeta_N(T) + \frac{e^2 \tau_{rel}}{16\hbar[\pi^{1/2}\xi(0)]^{D-2}} \times \int_0^\infty \frac{\exp(-\varepsilon u - gu^3)}{u^{(D-2)/2}}(1-2gu^3)du \qquad (3)$$

wherein D is the dimension of the space, e is the electron charge, $\zeta(0)$ is the Ginzburg-Landau (GL) coherence length of the superconductor, $\tau_{rel}$ is a dimensionless constant which describes how long the fluctuation Cooper pairs live in comparison with the prediction of BCS theory, $k_B$ is the Boltzmann constant, U is the voltage difference, L is the length of the sample, and $$\varepsilon = \frac{T-T_c}{T_c}, g = \frac{f^2}{12}, f = \frac{\pi}{8}\frac{eE\xi(0)}{k_B T_c}\tau_{rel}, E = \frac{U}{L}$$

The analysis of this formula shows that below $T_C$ where $\varepsilon<0$ the differential conductivity is really negative. This effect will form the basis for the current invention. The Ginzburg-Landau theory is formally applicable only close to $T_C$ for $|\varepsilon|<<1$, but qualitatively its results can be used even far from $T_C$. In other words the differential conductivity will remain negative even if the accuracy of the time dependent Ginzburg-Landau formula Eq. (3) is not very high. It is to be noted that the dimension of the current density in the formula depends on the dimension of the space. The dimension of the current density will be $[j_D]$A/m$^{D-1}$ for a bulk sample $[j_3]$=A/m$^2$, whereas for thin films with thickness $d_{film}<<\zeta(\varepsilon)$, the dimension of the current density will be $[j_2]$=A/m, and for a wire with a cross-section a lot smaller than $\zeta^2(\varepsilon)$, the dimension of the current density is just the dimension of the current $[j_1]$=A. Here $$\xi(\varepsilon) = \frac{\xi(0)}{\sqrt{|\varepsilon|}} \qquad (3)$$

is the temperature dependent coherence length. It is also convenient to introduce temperature dependent Cooper pair life-time $\tau(\varepsilon)$ $$\tau(\varepsilon) = \frac{\tau(0)}{|\varepsilon|}, \tau(0) = \frac{\pi}{16}\frac{\hbar}{k_B T_c}\tau_{rel} \qquad (4)$$

where the numerical coefficient π/16 is a result of the microscopic BCS theory. Analogously it is convenient to introduce a dimensionless temperature dependent electric field $$f_\varepsilon = \frac{f}{|\varepsilon|^{3/2}} = \frac{|e^*|E\xi(\varepsilon)\tau(\varepsilon)}{\hbar} << 1 \qquad (5)$$

where |e*|=2|e| is the charge of Cooper pair. The dummy parameter of the integration in Eq. (2) has the physical meaning of a dimensionless time u=t/τ(0), and analogously one can introduce another dimensionless time v=t/τ(ε).

The present theory is applicable for every superconductor which is homogeneous enough in order to avoid nucleation of the superconducting phase. This implies that the invention is related to every superconducting material that has this degree of homogeneity. The invention relates to both type I and type II superconductor materials. Although most technological important superconductors are type II superconductor material, the terahertz frequency oscillator also can be obtained for a type I superconductor material. The type of superconductor material thus is not limiting for the present invention. As an example, cuprate high-$T_C$ superconductors will be used for the further description of the general principles for generation of terahertz frequency oscillations, but the invention is not limited thereto. The cuprate high-$T_c$ superconductors contain as main structural detail superconducting $CuO_2$ planes. An example of such a superconductor is the $Bi_2Sr_2CaCu_2O_8$ superconductor which has a critical temperature $T_C \approx 90$ K and can be cooled by liquid nitrogen using working temperatures T=80 K and thus a reduced temperature $\varepsilon \approx -0.1$. The coherence length in the $CuO_2$ plane for other 90 K cuprates typically is in the order of $\zeta_{ab}(0) \approx 2$ nm. The $Bi_2Sr_2CaCu_2O_8$ superconductor typically is extremely anisotropic so that even for reduced temperatures $|\varepsilon|<<\approx 0.1$ the coherence length in perpendicular to $CuO_2$ plane direction can be smaller than the distance s between two planes $CuO_2$. Therefore, every two planes operate approximately as independent two dimensional (2D) layer and the number of layers $N_l$ can be determined from the film thickness $d_{film}$, i.e. $N_l = d_{film}/s$. If the superconductor is a strip with width w patterned from a layered superconductor, the total current is given by Eq. (6)

$$I = \frac{w \cdot d_{film}}{s} j_2(E) \qquad (6)$$

The obtained differential conductivity for the sample is then given by Eq. (7)

$$\sigma_{diff}(U) = \frac{di(U)}{dU} = \sigma_N + \frac{e^2 \tau_{rel} w d_{film}}{16\hbar s|\varepsilon|} S(g_\varepsilon) \qquad (7)$$

where the universal function $$S_{diff}(g_\varepsilon) = \int_0^\infty (1-2g_\varepsilon v^3)\exp(sign(-\varepsilon)-g_\varepsilon v^3)dv \qquad (8)$$

is calculated only ones for sign(−ε)=±1. The negative differential conductivity arises only for supercooled superconductor, i.e. cooled below $T_C$, so that sign$(-\epsilon)=1$. In Eq. (8) the electric field is parameterized by the dimension parameter $$g_\varepsilon = \frac{g}{|\varepsilon|^3} = \frac{1}{12} f_\varepsilon^2 = \frac{1}{12|\varepsilon|^3} \left( \frac{\pi e U \xi(0) \tau_{rel}}{8 k_B T_c L} \right)^2 \quad (9)$$

In order to have significant negative differential conductivity this parameter should be small enough $g_\epsilon \ll 1$.

Although the present example is described for a $Bi_2Sr_2CaCu_2O_8$ superconductor thin film strip having a specific width and acting as a combination of a number of 2D surfaces thus illustrating the 2D model, the invention also relates to real volumetric three dimensional (3D) superconductors and one dimensional 1D superconductors. As the fluctuations are stronger in low dimensional systems, an advantageous embodiment of the present invention will be the realization of negative differential conductivity in a microstructured/nanostructured stripe, film, tape, rod or other structure with micro-dimensions or nano-dimensions along at least one direction of conventional superconductor. Nanoscale dimensions are typically those which are less than 100 nm, mircoscale dimensions are typically those which are up to a few micrometer. The dimensions of the superconductor stripe is between 10 nm and 1000 nm. In this case the one dimensional (1D) formula can be used for the current. Alternatively, for a layered superconductor, the Lawrence-Doniach theory can be used, which results in interpolation so a system with an intermediate dimension $2 \leq D \leq 3$ can be obtained.

In order to illustrate how electric oscillations can be generated by a supercooled superconductor, the simplest possible electric scheme used in generators with tunnel diodes will be used. A scheme using conventional tunnel diodes is described in more detail by Chow in "Principles of Tunnel Diode Circuits", published by Wiley (New York, 1964). A complete explanation of this scheme and of the Van der Pol equation is described by Enns and McGuire in "Computer Algebra Recipes. A Gourmet's Guide to the Mathematical Models of Science" (Springer, Berlin, 2001) p 445. It will be appreciated by a person skilled in the art that the invention is not limited to system according to this simple electric scheme, but that also more complicated electric schemes for generating oscillations can be used.

In the scheme, the superconductor is connected in parallel with one resistor with resistance R and one capacitor with capacity C. Those 3 elements are sequentially connected in a circuit with one inductance L and a battery with electromotive force E. For a static current the voltage on the superconductor, capacitor and the resistor is just the voltage of the battery U=E. In the static solution the voltage of the inductance is zero.

Generating oscillations can e.g. be performed as follows. The circuit is cooled below the critical temperature of the superconductor $T_c$. In an initial stage, the superconductor is in the normal state, i.e. in a non-superconductive state, e.g. by heating with an energy pulse such as a short current or a laser pulse. The fluctuations of the voltage of the superconductors can be analyzed taking into account the static solution U(t)= E+x(t). The deviation from the static solution x=U(t)−E obeys the differential equation $$C \frac{d^2}{dt^2} x + \left[ \frac{1}{R} + \sigma_N + \sigma_{diff}(E+x) \right] \frac{d}{dt} x + \frac{1}{L} x \quad (10)$$

as is described by Enns and McGuire. If the auxiliary variable y(t) is introduced, defined by Eq. (11)

$$y(t) = \frac{d}{dt} x(t) \quad (11)$$

the equation Eq. (10) of this system reads as a set of ordinary differential equations defined by Eq. (11) and Eq. (12)

$$\frac{d}{dt} y(t) = -v(v)y - \omega^2 x \quad (12)$$

where $$v(x) = \frac{1}{C} \left[ \frac{1}{R} + \sigma_N + \sigma_{diff}(E+x) \right], \omega = \frac{1}{\sqrt{LC}} \quad (13)$$

For moderate accuracy, necessary for modeling of electronic circuits, an adaptive Runge-Kutta mehod can be used, as described by Press et al. in "Numerical Recipes in Fortran 77: the Art of Scientific Computing, Second Edition, Volume 1 of Fortran Numerical Recipes (Cambridge University Press, 2001) p 704, or a simple empirical formula for the time step Eq. (14) which follows the characteristic frequencies of the circuit, can be used.

$$\Delta t = \frac{0.1}{\sqrt{v^2(x) + 4\omega^2}} \quad (14)$$

The physical restrictions for the high frequencies are related only to the applicability of the time-dependent Ginzburg-Landau equation and static formulae for the current response. The static response approximation used for the derivation of Eq. (3) is applicable for $\omega \tau(\epsilon) \ll 1$. This means that for a high-$T_c$ superconductor this generator can operates for the whole radio frequency range and even for the far infrared region $$\omega \ll \frac{|\varepsilon| k_B T_c}{\hbar} \cong \frac{1}{\tau(\varepsilon)} \quad (15)$$

Now let us describe the appearance of the oscillations when the superconductor is supercooled. At a temperature $T_g$ determined by the solution of the equation $$-\sigma_{diff}(E, T_g) = \frac{1}{R} + \sigma_N(T_g) \quad (16)$$

the total differential conductivity of the circuit becomes zero. Further cooling leads to the appearance of negative conductivity, whereby the static solution x(t)=0 looses its stability, and the voltage in the circuit starts to oscillate. The main difference with the tunnel diode devices is that for superconductors there is not a definite region of negative conductivity as a function of the voltage. The current continuously increases when voltage decreases. The amplitude of the oscillations can be limited only by ohmic heating of the sample, for example. For thin films the heat current is determined mainly by the boundary resistance $R_h$ of the interface of the superconductor and insulator substrate. For high frequencies the dissipated power can be averaged and the local increase of the temperature of the superconductor above the ambient temperature can be calculated:

$$\Delta T = \frac{\langle I(t)U(t)\rangle_t}{R_h} \quad (17)$$

In such a way, a self-consistent equation for the reduced temperature is obtained:

$$\varepsilon = \frac{\Delta T + T - T_c}{T_c} \quad (18)$$

which has to be substituted in the formula for the differential conductivity Eq. (7). The complex problem of temperature and electric field oscillations can be easily simulated on a computer in order to optimize the parameters of the device and to optimize the initial stage of the experimental research. The present invention includes a computer system for simulation of a supercooled oscillator in accordance with the present invention as well as software for execution on a computing system for providing a simulation environment. The time dependent Ginzburg-Landau (TDGL) theory is the adequate tool whereon simulations can be based to analyse the operation of the proposed devices.

If in the initial stage the sample is already superconducting this is a less preferred mode of operation of the present invention as applying a voltage will either destroy superconductivity (hence leading to a satisfactory oscillation) or a space-inhomogeneous state will be generated.

One aspect of the present invention relates to keeping the superconductor in the normal but metastable state. The sample is preferably free from defects which can nucleate locally superconductivity, such as e.g. pin holes. Contacts on the superconductor sample should be prepared carefully as the current density is low and these regions could be a source of nucleation of superconducting domains. It is preferred to use only the central working region of the superconducting sample. Also de-pairing defects may be inserted in or near the contact areas of the superconducting sample. Such defects could be the magnetic impurities for conventional superconductors, Zn in $CuO_2$ plane, etc. Oxygenation of $YBa_2Cu_3O_{7-\delta}$ superconductors is also a tool to change the temperature at which the transition between normal state and superconducting state occurs locally, thus making only the central working region superconductive.

The amplitude of the oscillations also can be restricted by a current limitator with a maximal current $I_C(T)$, e.g. a narrow superconducting wire, or Josephson junction sequentially switched to the inductance $R_f = R_0 \theta(I_C(T)-I)$. Such an additional amplitude dependent dissipation will prevent the sample passing into the normal state when $U(t)=E+x(T)=0$. For the adjusted circuit, the following equations need to be solved $$E = L\frac{dI}{dt} + R_0 \theta(I_c(T) - I(t))I(t) + U(t) \quad (19)$$

with $$I(t) = \left(\frac{1}{R} + \frac{1}{R_N}\right)U(t) + C\frac{dU(t)}{dt} + I_{fl}[U(t)]$$

where if necessary the Boltzmann equation can be solved in the general case in order to obtain the high frequency functional for the fluctuation current $I_{fl}[U(t)]$ and eventually to take into account the self-interaction between fluctuation Cooper pairs.

The invention will be further described by way of particular embodiments based on the above described principles. The invention is not limited by these embodiments, nor by the accompanying drawings, but only by the claims. It is an advantage of the present invention that it is based on the above described principles, as these allow to obtain terahertz frequency oscillations with a significant higher output power than the prior art oscillator devices. Whereas the prior art devices are based on the Josephson effect, and thus comprise a weak link, i.e. a Josephson junction, the methods and devices in the current invention are based on the negative differential conductivity phenomenon. For this phenomenon, at least part of the superconductor material needs to be supercooled, which is not the case with the prior art devices. In contrast, in Josephson devices, the superconductive parts are in a superconducting state.

In a first embodiment (see FIG. 1), the present invention relates to an arrangement for a gigahertz or terahertz frequency oscillator 100. The frequency oscillator 100 comprises a superconductor material 110 which can be cooled to temperatures under the critical temperature $T_c$ for superconducting, and an electric energy source 120. The superconductor material 110 may be any type of superconductor material which is homogeneous enough in order to avoid nucleation of the superconducting phase. The superconductor material 110 may be in any suitable such as a volumetric (3D) material, as well as a thin film material, a rod, tube, a strip or similar. Superconductor materials are well known by the person skilled in the art. Some examples of conventional superconductor materials are described by Yi and Scwarzacher in Appl. Phys. Lett. 74 (1999) p 1746, by Martin in Science (1994) 266 p 1961, by Michotte et al. in Physica C (2002) 377 p 267, Dubois et al. in J. Mater. Res. 14 (1999) p 665 and by Ferain and Legras in Nucl. Instrum. Methods B 131 (1997) p 97. Furthermore, also high temperature superconducting materials can be used, like e.g. cuprates. The cuprate high-$T_c$ superconductors contain as main structural detail superconducting $CuO_2$ planes. An example of such a superconductor material is $Bi_2Sr_2CaCu_2O_8$ superconductor which has a critical temperature $T_c \approx 90$ K.

The electric energy source 120 may be a means for creating an electric field influencing the superconductor material 110 or a means for applying a voltage over the superconductor material 110. If a voltage is applied, this should be in the range between $10^{-2}$ V and $10^{-6}$ V, preferably between $10^{-3}$ V and $10^{-6}$ V. The optimum voltage to be applied depends on the thickness of the superconducting material used and on the specific terahertz frequency that needs to be obtained. The electric field may be generated by an electric field generator. Preferably, the electric energy source may be a direct means for providing an influencing electric field, but in a less preferred embodiment, the electric energy source also may be an indirect means for providing an influencing electric field. The electric energy source may be e.g. a DC voltage source.

In case high magnetic fields could influence the operation of the terahertz frequency oscillator 100, the terahertz frequency oscillator 100 furthermore may comprise means for magnetic shielding.

Based on the above described principles, generation of the terahertz frequency by the superconductor material 110 is obtained by the superconductor material 110 obtaining electric energy from the electric energy source 120 and the superconductor material 110 being cooled below the critical temperature of the superconducting phase transition $T_c$, without the superconductor material 110 becoming superconducting. This means that the superconductor material 110 is supercooled, i.e. it is in a non-superconducting state below the critical transition temperature $T_c$. The superconductor material 110 thus obtains a negative differential conductivity. The supercooled superconductive state can be obtained due to the provision of electric energy, i.e. e.g. applying a voltage, to the superconductor material 110. Special efforts to prevent the superconductor material 110 from nucleating superconductivity are preferred in or near a contact area where a voltage is applied. The contacts can e.g. be made de-pairing or include de-pairing agents, i.e. destructing Cooper pairs. On a macroscopic scale, this implies that the temperature at which the transition between normal state and superconducting state occurs is decreased compared to $T_c$. Different techniques can be applied to prevent nucleation of superconductivity, such as—the non-limiting possibilities of—e.g. providing a ferromagnetic metal near the contacts, doping regions of the superconductor material intentionally with impurities that have a de-pairing effect, etc. As described above typical defect impurities can be the magnetic impurities for conventional superconductors, Zn in $CuO_2$ plane, oxygenation of $YBa_2Cu_3O_{7-\delta}$ superconductors, etc. In this way superconductivity cannot be created in the contact area, nor in the volume of the superconductor material 110. It is to be noted that the Josephson junction in the prior art devices cannot be brought in a supercooled state because of the presence of the weak link between the two superconductor materials in this device.

The arrangement furthermore may comprise a means for cooling 130 the superconductor material substantially below the critical transition temperature $T_c$. The means for cooling 130 may be any suitable cryogenic device. The cooling may be such that the reduced temperature (see Eq. 18 for a definition of reduced temperature) is at least more negative than −0.01, preferably more negative than −0.05, even more preferably more negative than −0.1. The cooling means 130 also may be separated from the arrangement, as long as cooling of the superconductor material is provided. In principle only the part of the superconductor material that is creating the terahertz frequency needs to be supercooled, although also other parts of the arrangement may be cooled.

As will be discussed later, the terahertz frequency oscillator 100 may also comprise a means for tuning 140 the frequency of the terahertz frequency generated.

The exact output power of the terahertz frequency oscillator depends on the maximal cooling power for the active part of the superconductor strip. The output power of the terahertz frequency oscillator, based on the negative differential conductivity effect, typically is several times, e.g. about 10 times larger than the output power for the terahertz frequency oscillation created in a Josephson junction device. This is a significant advantage of the present invention.

The described embodiment of the present invention can be realized not only for in-plane conductivity in the main structural details of the superconductor materials, such as layers of $MgB_2$ or $CuO_2$ containing high-$T_C$ superconductors, but also for the currents in the so called c-direction perpendicular to these structural details, i.e. for example $MgB_2$ or $CuO_2$ layers. For $Bi_2Sr_2CaCu_2O_8$ voltage induced far infrared oscillations with low dissipations can be obtained as the negative differential conductivity can be coupled with below the gap plasma resonances for this material.

In a second embodiment, the arrangement comprises all characterising features of the previous embodiment, but the superconductor material is in the form of a thin film arrangement, having a lowered dimension. As described for the explanation of the general principles, the fluctuations obtained are stronger in low dimensional systems. In principle, a thin film can be regarded as having a lowered dimension D compared to a volume, i.e. 2<D<3. Furthermore, depending on the coherence lengths in the superconducting material, the thin film also can react as a group of 2D planes which is e.g. the case for the $Bi_2Sr_2CaCu_2O_8$ superconductor as it typically is extremely anisotropic and therefore has a coherence length which is shorter than the distance between two superconducting planes, as is described in more detail during the discussion of the general principle. The use of such a material having a large degree of anisotropy therefore is advantageous as the oscillations obtained will be larger.

Figure 2:
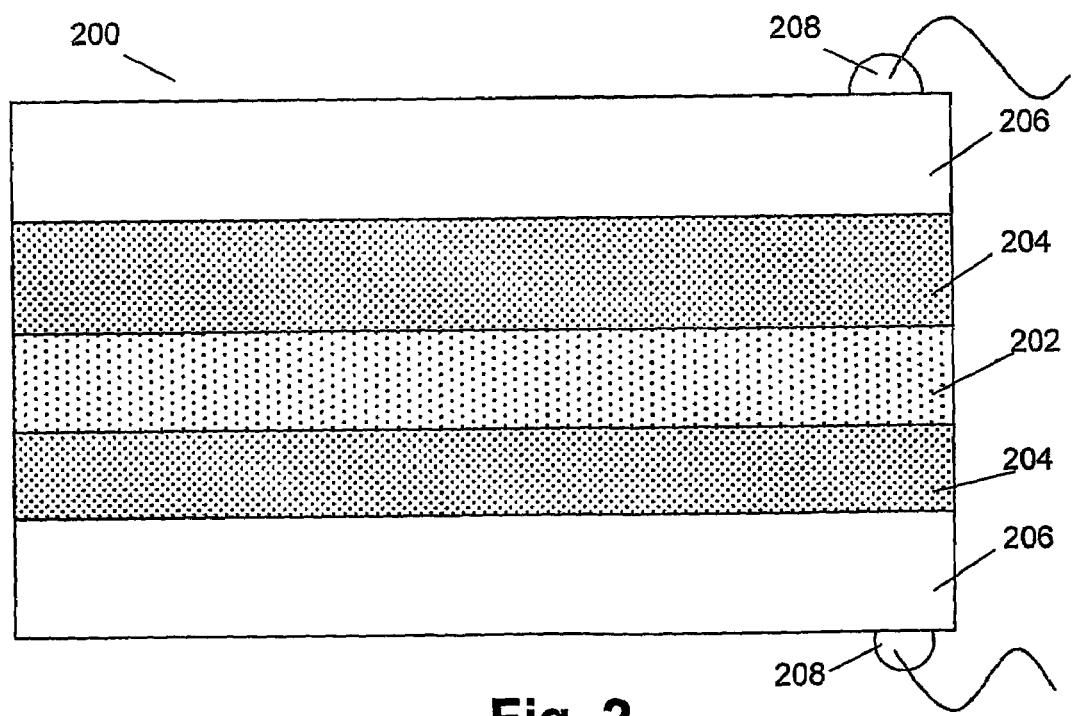
FIG. 2 shows a schematic diagram of a layered structure for use as a gigahertz or terahertz oscillator according to a second embodiment of the present invention.
Figure 3:
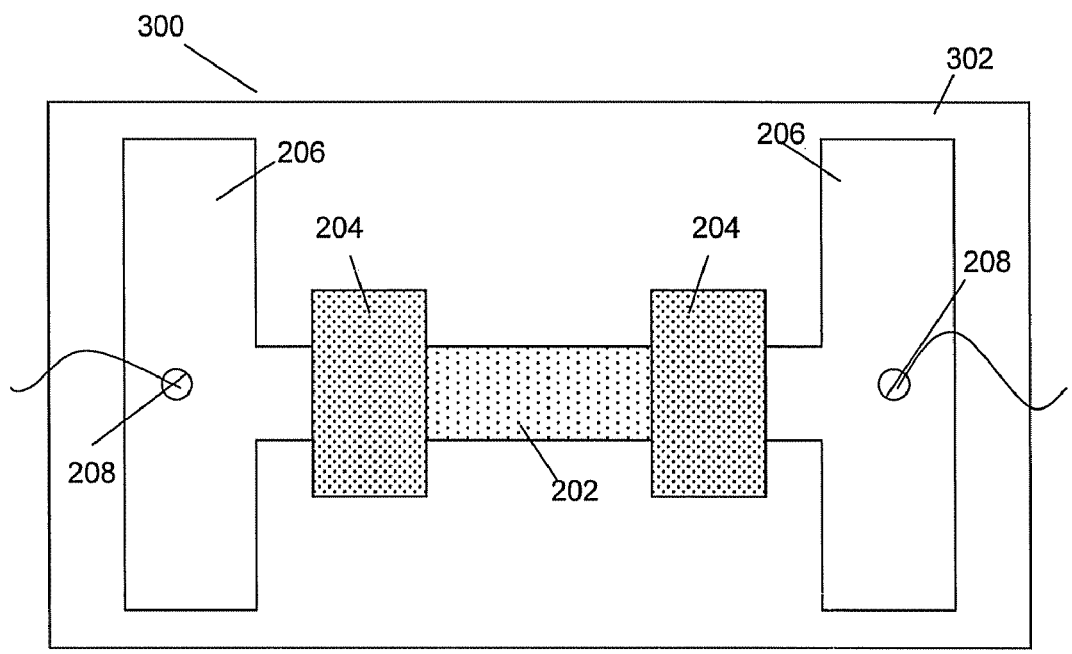
FIG. 3 is a schematic illustration of a microbridge setup for use as a gigahertz or terahertz oscillator according to the second embodiment of the present invention.

A large number of layered structures can be used for a gigahertz or terahertz oscillator according to the embodiments of the present invention. Two examples will be shown, although the present invention is not limited thereto. In a first example (see FIG. 2), the layered structure 200 comprises an active superconductor material part 202 that is—for operation—supercooled and thus has a negative differential conductivity. The active superconductor material part 202 is sandwiched between two layers 204 which prevent nucleation of superconductivity. These may be parts of the superconductor material 110 that are intentionally doped with de-pairing impurities, to prevent nucleation of superconductivity. Furthermore, two layers of superconductor material 206 are provided for contacting the superconductor material 110 with electrical contacts 208. The width of these layers may preferably be in the submicron range, although wider layers are not excluded. These layers also may be either separate layers of superconductor material or parts of the original superconductor material 110. This example is shown in FIG. 2. Alternatively, layers 204 and 206 can be replaced by a single layer of normal conductive material whereon electrical contacts 208 are provided for contacting the superconductor material 110. In a second example, shown in FIG. 3, the layered structure 300 is a microbridge or nanobridge. The structure has a strip of active superconductor material being supercooled 202, i.e. in the normal non-superconducting state although the material is cooled below the critical temperature for superconducting. This makes the strip of superconductor material being in a state of negative differential conductivity. The strip of active superconductor material 202 is coupled to normal conducting regions to which contact is made. Alternatively, as shown in FIG. 3, the superconductor material 110 has, besides an active region 202, intermediate regions 204 and contacting superconductor material regions 206. The geometric sizes of the specific layers in these embodiments are flexible, but typically in the micron to submicron range, as to comply with contemporary lightography. The intermediate regions 204 have de-pairing impurities to prevent nucleation of the superconductivity. Electrical connection by way of electrical connections 208 are provided to the contacting superconductor material regions 206. The layered structure is deposited on an insulator substrate 302. In the above described examples, the range of the film thickness, in which the effect can be obtained, typically is in the micron/submicron range, i.e. preferably between 10 nm and 1000 nm, the upper limit mainly determined by the necessaty to obtain effective cooling of the active volume of the superconductor below the temperature for negative differential conductivity. In the case of the cuprate layers a typical layer thickness used is about 100 nm.

In a third embodiment, the present invention relates to an arrangement for a gigahertz or terahertz oscillator whereby the same components and features are introduced as in embodiment 1 or 2, but wherein the superconductor material has a substantially 1 dimensional shape, such as e.g. a microstructured/nanostructured superconductor material, e.g. a superconductor material at least partly in the shape of a nanowire, or a nanotube. The typical size of the active parts of the microstructured/nanostructured superconductor material is of the order of thousands of nanometers. As fluctuations are more important for low dimensional systems, this leads to significant advantages. In this case 1D theory can be directly used and summation on the perpendicular modes of the Cooper pair wave guide can be performed. An example of the technology for preparation of suitable nanowires is described by Martin in Science 266 (1994) p1961, by Yi and Scwarzacher in Appl. Phys. Left. 74 (1999) p 1746, by Michotte et al in Physica C 377 (2002) p 267, by Dubois et al. in J. Mater. Res. 14 (1999) p 665 and by Ferain and Legras in Nucl. Instrum. Methods B 131 (1997) p 97 and their references. These documents describe by way of example suitable preparation methods of preparing nanowires of conventional superconductor materials and the way to contact them. It will be obvious for a person skilled in the art that similar techniques can be applied to prepare and contact superconductor nanowires for other superconductor materials, including high $T_c$ superconductor materials.

Figure 4:
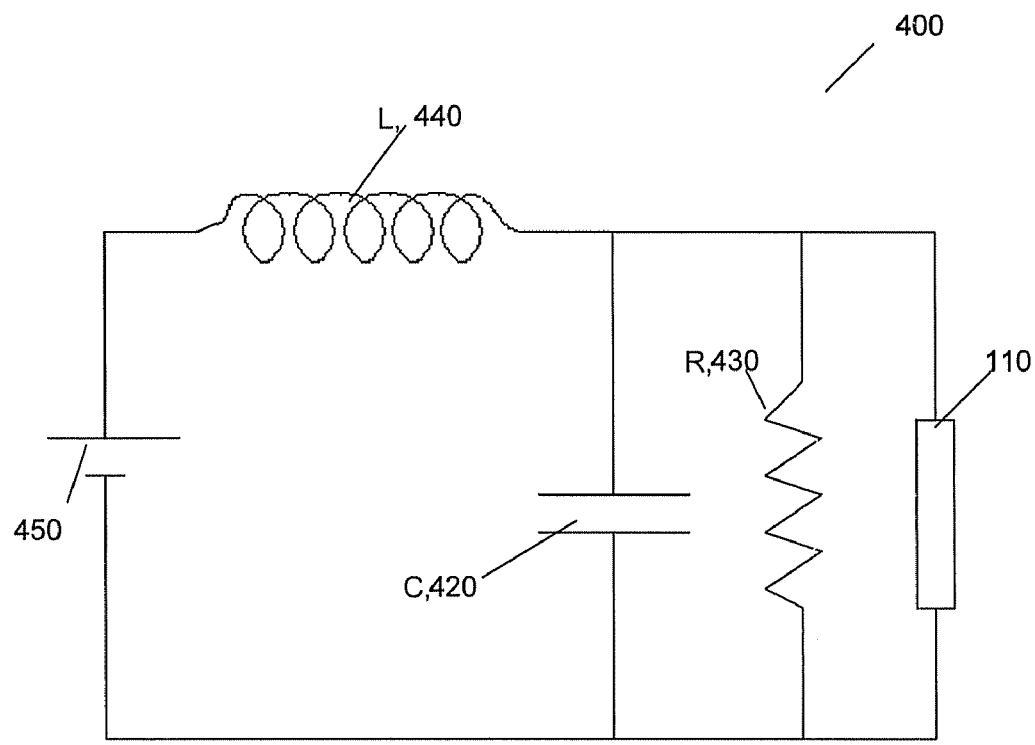
FIG. 4 shows an electric scheme for a gigahertz or terahertz oscillator according to a fourth embodiment of the present invention.

In a fourth embodiment, the present invention relates to a system for generating gigahertz or terahertz frequency oscillation, based on a gigahertz or terahertz frequency oscillator 100 according to any of the above described embodiments. The electric field is applied by putting the superconductor in a simple electric circuit, known for instance to be used for the realization of current oscillations in tunnel diodes. The tunnel diode, as active part of the generator of oscillations, therein is replaced by the superconductor structure with negative differential conductance in accordance with any of the embodiments of the present invention. An example of such a scheme is shown in FIG. 4, wherein furthermore a capacitor C 420, a resistor R 430, an inductance L 440 and a source of direct current DC 450 is present. In the scheme, the superconductor material 110 is connected in parallel with the resistor R 430 and the capacitor C 420. Those 3 elements are sequentially connected in a circuit 400 with one inductance L 440 and a battery 450 with electromotive force E. As described above during explanation of the general principle of generating electric oscillations, electric oscillations are obtained by supercooling at least the active part of the superconductor material 110 under a voltage, thus creating a negative differential conductivity. The nature of the negative differential conductivity created in the active superconductor material, i.e. the exact shape and composition of the active superconductor material is unspecific for the generation of the oscillations in the scheme 400 shown in FIG. 4. However the phase portrait, i.e. the current-voltage plot of the oscillations, depends on the properties of the active element. Far from the critical point the oscillations will be strongly in harmonic, i.e. the oscillations will contain overtones. Such a scheme, realised by separated elements can operate in the GHz range. It will be appreciated by a person skilled in the art that the invention is not limited to a system according to the simple electric scheme 400 described above, but that also other, possibly more complicated, electric schemes for generating oscillations can be used.

Figure 5:
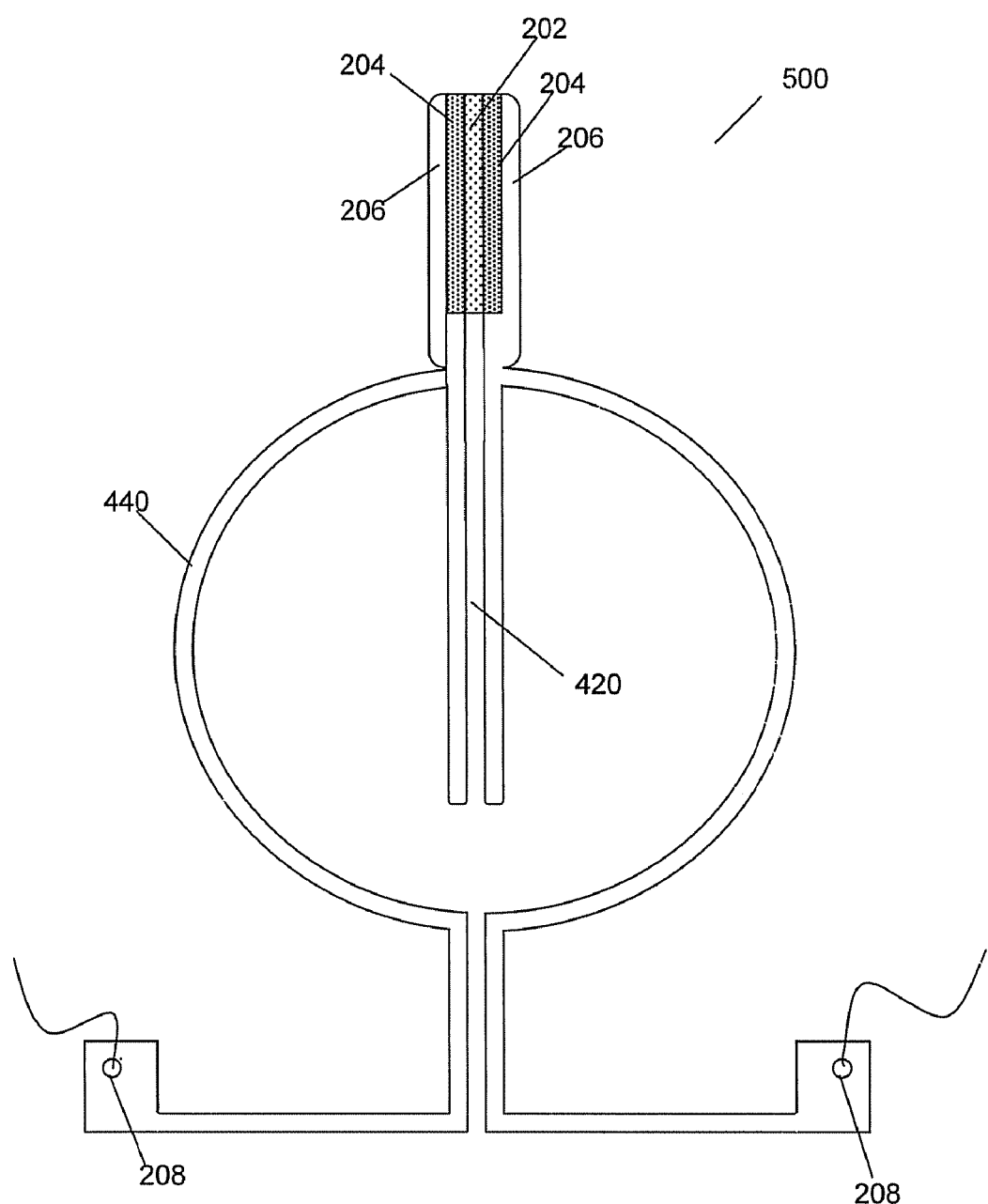
FIG. 5 is a model scheme for a gigahertz or terahertz frequency generator using a nanostructured superconductor according to the fourth embodiment of the present invention.

In an advantageous mode of this embodiment, the superconductor material 110, the capacitor C 420 and the inductance L 440 are incorporated together on a single interconnection substrate, such as incorporated in one chip by e.g. patterning a nanostructure in a superconductor. Preferably, the nanostructured superconductor is patterned from a thin high-$T_c$ superconducting layer. An illustrative scheme 500 is depicted in FIG. 5. All elements of the generator, i.e. the active supercooled superconductor, and the passive capacitors and inductances are preferably performed in one and the same chip of eventually high-$T_c$ superconductor. This allows the realization of a very small current oscillator, thereby allowing to obtain the highest possible frequency for oscillation. The superconductor material herein is applied as a superconductor strip, e.g. a nanostrip of superconductor material, which allows to use the model for a 1 dimensional superconductor material. A possible way to obtain such a suitable nanowire terahertz frequency oscillator is described in the third embodiment. As described, the scheme 500 for this preferred mode for terahertz frequency generation is performed as an integral scheme of a nanostructured superconductor. The superconductor material is a cooled superconductor nanowire under a voltage, having an active superconductor material region 202, regions 204 that are in the normal, i.e. not-superconducting state, obtained e.g. by doping regions of the superconductor material with de-pairing impurities, and contact areas 206 to put a voltage over the active part of the superconductor material 202. Furthermore, an inductance L 440 which can be performed as a circle of superconducting strip and a capacitor C 420 which can be performed as two parallel patterned superconductor strips are provided. The whole oscillator system 500 can be cooled to below the critical temperature for superconductivity or only the nanowire can be cooled. Contacts to a voltage source are provided by electrical contacts 208. In an alternative scheme, the load resistors in the pattern tunnel diode scheme is substituted with smaller ones or just replaced by short circuits. The voltage that is applied can be modified to obtain the desired negative resistance of the active superconductor material region 202. For the realization of a nanostructured superconductor oscillating system integrated on a single chip, one can expect chip technical applications. For these systems the maximal operating frequencies will be limited by the superconducting gap, which is in the THz range.

In a fifth embodiment of the present invention, a frequency generator based on the previous embodiments is described, wherein the generated oscillation frequency can be tuned. In principle, in the above mentioned embodiments, the operating frequency is fixed and stable by the geometric factors of the systems described. In order to tune the frequency, the capacity or the inductance can be changed. Any method of changing the capacity or inductance are included within the scope of the present invention. In order to modulate the oscillations, the passive elements can be modulated or, more preferred as it is simpler, the active elements, i.e. for example the superconductor material with negative differential conductance, are influenced. Influencing the superconductor material having a negative differential conductance can be obtained in several ways, e.g. by illumination with light or FIR radiation or by influencing with heat, etc.

A sixth embodiment of the present invention relates to the use of the generation of gigahertz or terahertz current oscillations in superconducting electronics. Thereby, superconductors are incorporated in electronics as an active element, using the generation of gigahertz or terahertz frequencies at a high output power based on the negative differential conductivity in accordance with the present invention. The superconducting layer, electrostatically doped by an appropriate gate electrode, can e.g. be the basis to make a superconducting field effect transistor (SuFET). Some examples of a number of applications that benefit from this type of electronics are:

Modulated gigahertz or terahertz oscillations generated by supercooled superconductors can be used for telecommunications. Superconducting field effect transistors, e.g. based on generation of submillimeter electromagnetic waves by electrostatically doped high-$T_c$ superconductors, can be extremely helpful for modulation of the oscillations. The latter can be used for wireless communications. Working transistors have already been obtained in the regime of supercooling. It is to be noted that the technical performance of the antennas are not essential for the source of the oscillations. When the superconductor is implemented as a thin layer the operation of the generator can be influenced by e.g. the electrostatic charge modulation as in a gate transistor, by heat, by light or simply by the change of the DC bias voltage.

Oscillations without modulations can be used as a source of terahertz radiation for spectroscopic applications and terahertz monitoring of the properties of materials, for medical and other applications in which Gunn diodes are used at the moment.

In a seventh embodiment, the gigahertz or terahertz frequency oscillator according to any of the embodiments 1 to 6 can be used as detection means in an opto-electronic detector. The gigahertz or terahertz frequency oscillator is sensitive to temperature and stabilized to oscillate near the critical temperature. If an amount of electromagnetic radiation is incident on the superconductor material, the oscillating characteristic of the terahertz frequency will be changed. Therfore the gigahertz or terahertz oscillator can be used as an opto-electronic detector such as e.g. a bolometer. After calibration of the system, the amount of change in oscillator behavior may be a measure for the amount of electromagnetic radiation that has been incident on the oscillator. In this way a quantitative detector can be obtained. A big advantage of the use of a gigahertz or terahertz frequency oscillator based on the negative differential conductivity in a supercooled superconductor is the large sensitivity that is obtained. It will be clear for a person skilled in the art that embodiments for a gigahertz or terahertz frequency oscillator wherein the supercooled superconductor material substantially has a lower dimensional shape, such as a nanowire-based embodiment, the obtained sensitivity for opto-electronic detection will in principle be the largest.

A disadvantage of the modern terahertz frequency systems is the lack of a high-power, low-cost, portable room temperature THz source, i.e. the lack of a low-cost, portable room-temperature $T_c$ superconductor. Nevertheless, the devices, systems and methods of the present invention can be applied for such a superconductor, when available.

Besides the development of different systems for technological applications, the principle of negative differential conductivity, investigated in the case of zero temperatures $T \ll T_C$, may provide a new tool to investigate the quantum theory critically, based on the critical behavior at small electric fields. In such a way the development of an applied research can lead to further development of this theory, which can provide novel information for further technological developments.

Other arrangements for accomplishing the objectives of the method and system for generating gigahertz or terahertz frequency oscillations embodying the invention will be obvious for those skilled in the art. It is to be understood that although preferred embodiments, specific constructions and configurations, as well as materials, have been discussed herein for devices according to the present invention, various changes or modifications in form and detail may be made without departing from the scope and spirit of this invention. For example, although in the specific embodiments described above mainly systems and devices are described, the invention also relates to the corresponding methods for generating gigahertz or terahertz frequency oscillations, waves and radiation. The general principle for these methods is described above in the general principle for obtaining gigahertz or terahertz frequency oscillations. Other applications are the use of the non-linear conductivity characteristic of the superconductors in the gigahertz or terahertz frequency oscillators, as described above, for frequency mixers and transistors. Furthermore, narrow band gigahertz or THz sources, such as the gigahertz or terahertz frequency oscillators described above, are crucial for high-resolution spectroscopy applications. They have also broad potential applications in telecommunications, and are particularly attractive for extremely high bandwidth intersatellite links, as described by Ferguson and Zhang in Nature Materials 1, p 26 (2002). An other application is phonon spectroscopy as an erstz phonon laser can be obtained by transmitting THz electromagnetic waves in hyper sound phonons using grating and plasma resonances of two dimensional electron gas in a semiconductor.

The invention claimed is:

1. An arrangement for a gigahertz or terahertz frequency oscillator comprising:
    a length of a continuous, superconductor material, at least part of said superconductor material being maintained in a first state wherein the at least part of said superconductor material is cooled under the critical temperature for superconductivity but wherein the at least part of said superconductor material is not in a superconducting state, and the at least part of said superconductor material being in a state of negative differential conductivity,
    an electric energy source and oscillation means coupled to said at least part of said superconductor material and adapted for generating gigahertz or terahertz frequency electric oscillations in at least part of said superconductor material, wherein the at least part of said continuous, superconductor material is a nanostructured or microstructured superconductor material.

2. An arrangement for a gigahertz or terahertz frequency oscillator according to claim 1, wherein said oscillation means comprise a parallel connection of a capacitor C with a resistance R, coupled in series with an inductance L.

3. An arrangement for a gigahertz or terahertz frequency oscillator according to claim 1, wherein said gigahertz or terahertz frequency electric oscillations are within a frequency range of 0.1 to 10 terahertz.

4. An arrangement for a gigahertz or terahertz frequency oscillator according to claim 1, said arrangement furthermore comprising a cooling means for bringing the at least part of said continuous, superconductor material into the first state.

5. An arrangement for a gigahertz or terahertz frequency oscillator according to claim 1, wherein the at least part of said continuous, superconductor material is at least one nanowire.

6. An arrangement for a gigahertz or terahertz frequency oscillator according to claim 1, wherein said electric energy source comprises a means for applying a voltage to said at least part of said continuous superconductor material.

7. An arrangement for a gigahertz or terahertz frequency oscillator according to claim 6, wherein said continuous, superconductor material comprises regions adapted for preventing nucleation of the conductivity.

8. An arrangement for a gigahertz or terahertz frequency oscillator according to claim 7, wherein said regions adapted for preventing nucleation of the conductivity comprise de-pairing impurities.

9. An arrangement for a gigahertz or terahertz frequency oscillator according to claim 6, wherein said continuous, superconductor material furthermore comprises regions adapted for acting as an inductance and/or a capacitor.

10. An arrangement for a gigahertz or terahertz frequency oscillator according to claim 6, wherein said arrangement furthermore comprises an inductance and/or a capacitor connected to said superconductor material.

11. An arrangement for a gigahertz or terahertz frequency oscillator according to claim 1, further comprising a means for tuning said generated gigahertz or terahertz frequency electric oscillations.

12. A gigahertz or terahertz frequency wave generator, said generator using a gigahertz or terahertz frequency oscillator according to claim 1, wherein said gigahertz or terahertz frequency electric oscillations generate a gigahertz or terahertz frequency wave or gigahertz or terahertz frequency radiation.

13. A gigahertz or terahertz frequency wave generator according to claim 12, wherein said gigahertz or terahertz frequency wave or gigahertz or terahertz frequency radiation is in the frequency range of 0.1 to 10 THz.

14. A transmitter for transmitting gigahertz or terahertz pulses comprising a gigahertz or terahertz frequency wave generator according to claim 13.

15. The use of the gigahertz or terahertz frequency oscillator according to claim 1 for gigahertz or terahertz spectroscopy.

16. The use of the gigahertz or terahertz frequency oscillator according to claim 1 for gigahertz or terahertz imaging.

17. A method for generating high frequency oscillations, said method comprising the steps of bringing and maintaining at least part of a length of a continuous, superconductor material into a first state wherein the at least part of said superconductive material is cooled under the critical temperature for superconductivity but wherein the at least part of said superconductive material is not in a superconducting state, said part being in a state of negative differential conductivity, applying electric energy to said at least part of said superconductor material and to oscillating means, said electric energy being adapted for generating gigahertz or terahertz frequency electric oscillations in said at least part of said superconductor material, wherein the at least part of said continuous, superconductor material is a nano-structured or microstructured superconductor material.

18. A method according to claim 17, wherein said gigahertz or terahertz frequency electric oscillations are within a frequency range of 0.1 to 10 terahertz.

19. A method according to claim 17, said method furthermore comprising tuning said gigahertz or terahertz frequency by illuminating the at least part of a continuous, superconductor material with any of visual light, heat or far infrared radiation or by adjusting an electrical component.

20. A method according to claim 17, said method furthermore comprising generating a gigahertz or terahertz frequency wave or gigahertz or terahertz frequency radiation with said gigahertz or terahertz frequency electric oscillations.

21. An arrangement for a gigahertz or terahertz frequency oscillator comprising:

a length of a continuous, superconductor material, at least part of said superconductor material being maintained in a first state wherein the at least part of said superconductor material is cooled under the critical temperature for superconductivity but wherein the at least part of said superconductor material is not in a superconducting state, and the at least part of said superconductor material being in a state of negative differential conductivity, an electric energy source and oscillation means coupled to said at least part of said superconductor material and adapted for generating gigahertz or terahertz frequency electric oscillations in at least part of said superconductor material, wherein said oscillation means comprise a parallel connection of a capacitor C with a resistance R, coupled in series with an inductance L.

* * * * *